(12) United States Patent
Plank

(10) Patent No.: US 12,431,321 B2
(45) Date of Patent: Sep. 30, 2025

(54) SAMPLE HOLDER TRANSFER DEVICE WITH SAMPLE CARRIER FIXING ELEMENT

(71) Applicant: LEICA Mikrosysteme GmbH, Vienna (AT)

(72) Inventor: Heinz Plank, Wetzlar (DE)

(73) Assignee: LEICA MIKROSYSTEME GMBH, Vienna (AT)

( * ) Notice: Subject to any disclaimer, the term of this patent is extended or adjusted under 35 U.S.C. 154(b) by 287 days.

(21) Appl. No.: 17/963,210

(22) Filed: Oct. 11, 2022

(65) Prior Publication Data

US 2023/0120426 A1    Apr. 20, 2023

(30) Foreign Application Priority Data

Oct. 15, 2021  (EP) .................................. 21202962

(51) Int. Cl.
   *H01J 37/20*    (2006.01)
   *G01N 1/42*    (2006.01)
   *G02B 21/24*    (2006.01)

(52) U.S. Cl.
   CPC .............. *H01J 37/20* (2013.01); *G02B 21/24* (2013.01); *G01N 1/42* (2013.01)

(58) Field of Classification Search
   CPC ......... G02B 21/24; G02B 21/34; H01J 37/20; H01J 2237/2001; H01J 2237/2007; H01J 2237/201; H01J 2237/204; G01N 1/42
   See application file for complete search history.

(56) References Cited

U.S. PATENT DOCUMENTS

| | | | |
|---|---|---|---|
| 10,144,010 B2 | 12/2018 | Lihl et al. | |
| 2018/0290144 A1 | 10/2018 | Lihl et al. | |
| 2019/0131106 A1* | 5/2019 | Gubbens | .......... G01N 23/20025 |
| 2020/0273659 A1* | 8/2020 | van den Boogaard | . H01J 37/20 |

FOREIGN PATENT DOCUMENTS

| | | |
|---|---|---|
| EP | 3385771 A1 | 10/2018 |
| EP | 3477680 A1 | 5/2019 |

* cited by examiner

*Primary Examiner* — Timothy P Graves
(74) *Attorney, Agent, or Firm* — LEYDIG, VOIT & MAYER, LTD.

(57) ABSTRACT

A sample holder transfer device is for use in cryo-microscopy and for transferring a sample holder to an analysing or processing unit. The sample holder is configured for holding a sample carrier carrying a sample. The sample holder transfer device is configured to receive the sample holder, the sample holder including a sample carrier fixing element. At least one section of the sample carrier fixing element is configured, when in a first position, to fix the sample carrier to the sample holder, and, when in a second position, to release the sample carrier or provide access to an area where the sample carrier is to be placed. The sample holder transfer device includes a switching mechanism operable to switch the at least one section of the sample carrier fixing element of the sample holder from the first to the second position or from the second to the first position.

13 Claims, 7 Drawing Sheets

SAMPLE HOLDER TRANSFER DEVICE WITH SAMPLE CARRIER FIXING ELEMENT

CROSS REFERENCE TO RELATED APPLICATIONS

This application claims benefit to European Patent Application No. EP 21202962.3, filed on Oct. 15, 2021, which is hereby incorporated by reference herein.

Reference is had to a parallel European patent application EP 21 202 905.2 with the title "Sample holder for holding a sample carrier carrying a sample," filed on the same day as the EP 21202962.3 application, and which is hereby incorporated herein by reference.

FIELD

The present invention relates to a sample holder transfer device for use in cryo-microscopy for transferring a sample holder to an analysing or processing unit, the sample holder holding a sample carrier carrying a sample.

BACKGROUND

Cryo-microscopy in the meaning of the present application particularly includes cryo-light microscopy and cryo-electron microscopy. Samples to be examined by cryo-microscopy are mostly prepared beforehand by a method called cryofixation. In this method, a water-containing sample is frozen very quickly (cryofixed) to a temperature of less than −150° C., i.e. it is cooled very rapidly in order to avoid the formation of ice crystals. Cryofixation has proven to be particularly suitable for investigations of structural biology. The objects to be investigated, for examples cells, enzymes, viruses, or lipid layers, thereby become embedded in a thin, vitrified ice layer. The great advantage of cryofixation is that the biological structures can be obtained in their natural state. For example, a biological process can be halted at any point in time by cryofixation, and investigated in that vitrified state, for example in a cryo-electron microscope but also in a light microscope with corresponding sample cooling. In this context, cryo-light microscopy serves principally to locate relevant regions of the sample (regions of interest), which can be noted and then re-localised and viewed in more detail in a cryo-electron microscope.

In order not to impair the quality of the frozen samples, it is advantageous that they be transferred in cooled and contamination-free, particularly water-free, fashion between the processing units being used, for example a cryofixation device, a freeze fracture apparatus, and a coating apparatus, and the analytical devices, in this case principally a cryo-light microscope and a cryo-electron microscope. Sample transfer devices, such as disclosed in U.S. Pat. No. 10,144,010 B2, can be used to transfer a sample under cryogenic conditions between said processing units and/or analysing units.

Cryofixation as discussed above may be done on the sample carried by the sample carrier/grid. The grids typically comprise a metal mesh or metal grid (e.g. made of copper or gold) and a support film (e.g. a carbon web). After placing the samples on the grids, samples are cryofixed. Such grids also sometimes referred to as "baregrids." For ease of handling, the thin grids may be clamped into special metal frames. The combined structure of sample grid and metal frame is also known as "autogrid." It is noted that also other kinds of sample carriers, also in the field of cryo-microscopy, are in use.

In a next step, the sample carrier carrying the vitrified sample is loaded into a sample holder, also known as "cartridge". In the example discussed above, one or more grids are placed onto or loaded into the sample holder/cartridge. The grids are mostly loaded into the cartridge in an atmosphere of cold vaporized liquid nitrogen in the inside of a sample holder transfer device, also known as "shuttle".

A sample holder configured to receive a sample carrier/grid carrying a vitrified sample is disclosed in EP 3 385 771 A1. The sample holder comprises sample carrier fixing means for clamping a sample carrier between a leaf spring biased towards the intended position of the sample carrier, and an edge at the contact surface of the sample holder, at the opposite side of the leaf spring. In order to load a sample carrier into such a sample holder, the sample carrier grabbed by a pair of tweezers is pressed with its opposite side against the leaf spring such that the leaf spring allows placing the sample carrier onto the contact surface of the sample holder. The shuttle may then be connected to a cryo-microscope and the sample holder/cartridge carrying the sample carrier is transferred into the cryo-microscope for examination.

SUMMARY

In an embodiment, the present disclosure provides a sample holder transfer device for use in cryo-microscopy for transferring a sample holder to an analysing or processing unit. The sample holder is configured for holding a sample carrier carrying a sample. The sample holder transfer device is configured to receive the sample holder, the sample holder including a sample carrier fixing element. At least one section of the sample carrier fixing element is configured, when in a first position, to fix the sample carrier to the sample holder, and, when in a second position, to release the sample carrier or to provide access to an area where the sample carrier is to be placed. The sample holder transfer device includes a switching mechanism operable to switch the at least one section of the sample carrier fixing element of the sample holder from the first position to the second position or from the second position to the first position.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
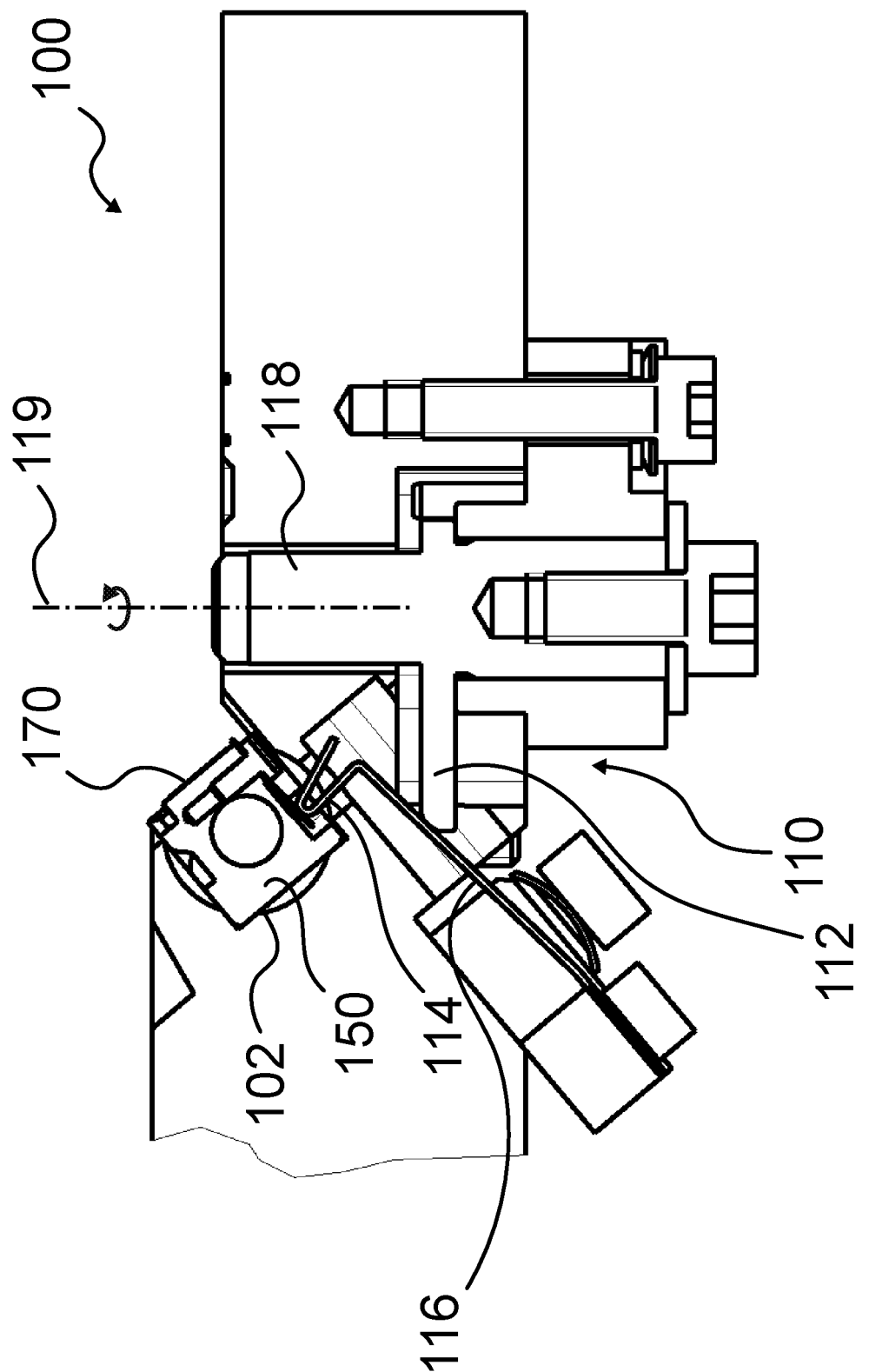
FIG. 1 schematically shows a detail of a sample holder transfer device according to an embodiment of the present invention in a perspective cross-section view, the sample holder transfer device including a sample holder.

Embodiments of the present invention provide an improved sample holder transfer device. In particular embodiments, the sample holder can be used in the form of a cartridge, in which at least one sample carrier, for instance, in the form of a sample grid, can be inserted, the at least one grid carrying a sample, particularly for being processed and/or analysed in cryo-microscopy.

The sample holder transfer device for transferring a sample holder, the sample holder being configured for holding a sample carrier, is configured to receive the sample holder, particularly at a dedicated position, also called "loading position." The sample holder transfer device is configured to receive a sample holder, which comprises a sample carrier fixing element, at least one section of the sample carrier fixing element being configured, when in a first position, to fix the sample carrier to the sample holder, and, when in a second position, to release the sample carrier or to provide access to an area where the sample carrier is to be placed (or located).

Embodiments of the present invention provide a sample holder transfer device designed to handle such kinds of sample holders in that the sample holder transfer device further comprises a switching mechanism operable to switch the at least one section of the sample carrier fixing element of the sample holder from the first position to the second position and/or from the second position to the first position. With such a sample holder transfer device it is no longer necessary to directly operate the sample carrier fixing element e.g. manually, e.g. by a pair of tweezers, in order to either "open the sample carrier fixing element", i.e. moving the at least one section of the sample carrier fixing element to its second position, or "close the sample carrier fixing element", i.e. moving the at least one section of the sample carrier fixing element to the first position. The process of opening and closing the sample carrier fixing element can now be performed via the sample holder transfer device itself, more particularly via its switching mechanism. Thus, the process of opening the sample carrier fixing member does no longer depend on the hitherto manual process of inserting the sample carrier(s).

A sample holder transfer device according to an embodiment of the present invention thus provides the opportunity of a simplified process of inserting and removing a sample carrier like a sample grid into and from a sample holder like a cartridge used in cryo-microscopy, respectively.

More particularly, a workflow in cryo-microscopy may be facilitated, as it is, for instance, no longer necessary to first insert a sample carrier/grid into the sample holder/cartridge, and in a second step to insert the sample holder/cartridge into a sample holder transfer device. In contrast, the sample holder may first be inserted into a sample holder transfer device according to an embodiment of the present invention, and the process of inserting and removing of sample carriers/grids can easily be performed by operating the switching mechanism of the sample holder transfer device accordingly.

The switching mechanism provided in an embodiment of the present invention is further configured to fix the sample holder in a loading position, when the switching mechanism is operated to switch the at least one section of the sample carrier fixing element to its second position such that a sample carrier can be inserted into or removed from the sample holder. Fixing the sample holder in a loading position while inserting or removing a sample carrier facilitates the handling process.

In an embodiment, the switching mechanism is configured to be set into a first position, in which the switching mechanism switches the at least one section of the sample carrier fixing element into its first position ("closed" position), and the switching mechanism is configured to be set into a second position, in which the switching mechanism switches the at least one section of the sample carrier fixing element into its second position ("open" position).

Generally, and also in particular embodiments, an "operation of the switching mechanism" may consist of or comprise at least one of a pushing, a pressing, a pivoting, a rotary, a pulling and a touching operation. By means of such an operation of the switching mechanism, the sample carrier fixing element is switched—as defined above—from an open position to a closed position or vice versa.

The "switching mechanism" can consist of or comprise at least one of the following elements: an essentially rigid element being configured to have the function of a lever or being formed as a lever, said lever being pivotable around an axis such that actuating (e.g. pressing or pulling) one end of the lever leads to a corresponding movement of the other end of the lever, which—directly or indirectly—switches the sample carrier fixing element—as defined above—from one position (open/closed) to another (closed/open); an essentially resilient element, the resilient element preferably being biased to a position, in which the sample carrier fixing element is in a closed position, such that a actuating force onto the resilient element would result in the sample carrier fixing element switching into its open position. Another element may be a slide element or a slider, which can be moved into a position in order to act upon the sample carrier fixing element to switch it from one position into another. Yet another element may be a cam element having a cam surface, which—directly or indirectly—is in contact with the sample carrier fixing element and, depending on the point of contact at the cam surface, switches the sample carrier fixing element from one position to another. Still another element may also be a touch button, which is touched in order to cause the sample carrier fixing element to switch from one position into another. It should be noted that also a combination of the aforementioned elements may be suitable to implement a switching mechanism according to embodiments of the present invention.

It should be noted that the switching mechanism of the sample holder transfer device may act directly upon the at least one section of the sample carrier fixing element. However, according to other embodiments of the present invention, the switching mechanism of the sample holder transfer device may act upon another section of the sample carrier fixing element, which section is in operative connection to the other section that is fixing or releasing the sample carrier. Corresponding embodiments will be discussed further below.

In an embodiment, the switching mechanism comprises a slide element or a cam element, the slide element or cam element being configured to—directly or indirectly—interact with the at least one section of the sample carrier fixing element in order to, upon operation of the switching mechanism (110), switch the at least one section of the sample carrier fixing element into its first (closed) position and/or into its second (open) position. In this embodiment, the slide element or cam element can either act directly upon said at least one section of the sample carrier fixing element or onto another section of the sample carrier fixing element, which section is operatively coupled with the other section for fixing or releasing the sample carrier. Further, in this embodiment, the switching mechanism may be configured to directly move the slide element or the cam element in order to act upon the sample carrier fixing element; it is, however, also possible and, in some embodiments, also preferred if the slide element or the cam element indirectly act upon the sample carrier fixing element as will be explained further below.

In an embodiment where the switching mechanism comprises a slide element (slider) or a cam element, the switching mechanism may further comprise an intermediate element, the slide element or cam element being configured to act upon the intermediate element. The intermediate element may be a resilient element or a rigid element or a combination of both, the intermediate element being operated by the slide element or cam element in order to act upon the sample carrier fixing element to switch—as defined above—from one position into another.

In an embodiment, the intermediate element comprises a spring element. The spring element might be a leaf spring. One end of the spring element may be configured to act upon the sample carrier fixing element. Again, it may act directly onto the at least one section of the sample carrier fixing member configured to fix or to release the sample carrier, or it may act upon another section operatively coupled to the section configured to fix or release the sample carrier.

In another embodiment where the switching mechanism is configured to be set into a first position and into a second position, said positions corresponding to the open position and the closed position of the sample carrier fixing element, respectively, the switching mechanism may comprise a pin, the pin being rotatably mounted in the sample holder transfer device and being rotatable about its longitudinal axis and being configured to assume, by rotation about a predetermined angular range, two positions corresponding to the first position and the second position of the switching mechanism. This embodiment facilitates handling of the switching mechanism in that the pin may be configured to be operated by a tool like a screwdriver for rotating the pin about its longitudinal axis. Furthermore, this embodiment allows a reliable and robust configuration of this part of the switching mechanism. In this embodiment, the pin may further comprise the above-mentioned cam (or slide) element. In this embodiment, rotation of the pin leads to a corresponding movement e.g. of the cam surface of the cam element, which cam surface—directly or indirectly—acts upon the sample carrier fixing element in order to switch it from one position into another.

In this embodiment, the switching mechanism may comprise the pin comprising the cam element, which, in a first position of the pin exerts no force or a force less than a predetermined threshold force onto the spring element, and which pin upon rotation about the predetermined angular range assumes its second position, in which the cam element exerts a force equal to or exceeding the threshold force onto the spring element. In this embodiment, if a force exceeding a threshold force acts upon the spring element, the spring element is moved into a position where it switches the sample carrier fixing element—as defined above—from one position into another. The spring element may be biased towards a position where it does not act upon the sample carrier fixing element, such that, when a force exceeding the threshold force acts upon the spring element, the spring element switches the sample carrier fixing element into another position. Preferably, the sample carrier fixing element is biased towards the closed position. In this case, exerting a force exceeding the threshold force onto the spring element would lead to the sample carrier fixing element switching into its open position.

Further embodiments of the present invention relate to a sample holder transfer device according to the embodiments discussed above, which sample holder transfer device includes the sample holder configured for holding a sample carrier.

In embodiments where the sample holder transfer device includes the sample holder, the sample holder may comprise a sample carrier fixing element, at least one section of the sample carrier fixing element forming a first section configured, when in a first position, to fix the sample carrier to the sample holder, and, when in a second position, to release the sample carrier or to provide access to an area where the sample carrier is to be placed; the sample carrier fixing element, in this embodiment, further comprises a second section, the second section being operable by the switching mechanism of the sample holder transfer device such that upon operation of the second section the first section switches from the first into the second position or from the second into the first position.

As the sample carrier fixing element, in this embodiment, comprises two sections, namely a first and a second section, the second section can be operated in order to switch the first section into a position where it either fixes or releases the sample carrier. Thus, operation of the sample carrier fixing element is decoupled from its function to either fix or release the sample carrier. In other words, it is no longer necessary to press the sample carrier fixing element with the sample carrier itself into a position where the sample carrier can be placed onto the corresponding contact surface provided in the sample holder. In contrast, a different section of the sample carrier fixing element can now be operated to switch the first (fixing) section into its open (second) position in order to be able to properly locate and orientate the sample carrier. In a next step, the first section may either automatically or by itself return or move into the first (fixing) position, or the first section switches into this first position upon (another) operation of the second section of the sample carrier fixing element.

The sample carrier fixing element provided in an embodiment of the present invention may consist of or comprise a spring element or a resilient element or an elastic element but also a rigid element, which itself is fixed to the body of the sample holder or is an integral part of the sample holder. Alternatively or additionally, the sample carrier fixing element, particularly its first section, may consist of or comprise a clamp or a clip, either being fixed to the body of the sample holder or being an integral element of the sample holder, for securing the sample carrier. Further, it is conceivable to implement the second section of the sample carrier fixing element in the form of a push button, rotary button, resilient switch, snap switch or the like.

The sample carrier fixing element may comprise an essentially rigid element being configured to have the function of a lever or being formed as a lever, said lever being pivotable around an axis between the first and second sections such that the first section moves or pivots when the second section is moved or pivoted.

In an embodiment, the sample carrier fixing element comprises an essentially resilient element having a first section and a second section, said sections, in an embodiment, being at opposite ends of the resilient element, the resilient element being configured (in a lever-like fashion)

such that the first section moves or pivots when the second section is moved or pivoted. The first section of the sample carrier fixing element may be in the form of a (retaining) leaf spring biased towards the designated area or position of the sample carrier, and the second section may be in the form of another leaf spring (or another resilient part) in connection with the first section, as will also be described in more detail below.

In a further embodiment, the switching mechanism of the sample holder transfer device switches the first section of the sample carrier fixing element of the sample holder from the first position to the second position and/or from the second position to the first position by acting upon the second section of the sample carrier fixing element. More particularly, in this embodiment, it is expedient to use a switching mechanism configured to be set into a first position and into a second position, as described above, and to configure the switching mechanism such that, in its first position, no force or a force less than a predetermined force is exerted onto the second section of the sample carrier fixing element, and, in its second position, a force equal to or greater than the predetermined force is exerted onto the second section of the sample carrier fixing element. In this embodiment, a threshold force, namely the predetermined force, is necessary to switch the sample carrier fixing element from one position into another. The switching is done by exerting the predetermined force onto the second section of the sample carrier fixing element such that the first section of the sample carrier fixing element switches from a first (closed) position to a second (open) position or vice versa. In this embodiment, it is particularly preferred if the predetermined force exerted onto the second section of the sample carrier fixing element leads to an opening of the sample carrier fixing element, namely to the first section switching from the first position to the second position in order to release the sample carrier or to provide access to an area where the sample carrier is to be placed.

As already mentioned above, in another embodiment, the switching mechanism may be configured to fix the sample holder in a position (loading position), when the switching mechanism is operated to switch the first section of the sample carrier fixing element into its second (open) position. In an embodiment, where the switching mechanism itself is configured to be set into a first position and into a second position, the switching mechanism is configured to fix the sample holder when the switching mechanism is set into its second position. Inserting and removing sample carriers into or from the sample holder is facilitated if the sample holder is in a fixed position.

In an embodiment where the sample holder transfer device comprises a pin, the pin being rotatably mounted in the sample holder transfer device and being rotatable about its longitudinal axis in order to assume, by rotation about a predetermined angular range, two positions corresponding to the first and the second position of the switching mechanism, as already discussed above, the pin may be arranged to be operated by a tool like a screwdriver from essentially the same side from where the sample carrier is to be placed into the sample holder. In this embodiment, a user can easily locate a sample carrier into the sample holder while operating the pin at the sample holder transfer device to either provide access to the area where the sample carrier is to be placed or to fix the sample carrier after insertion of the sample carrier.

It should be noted that the above features of the embodiments can—wholly or in part—be combined to achieve other embodiments still falling under the scope of the present inventive concept.

As used herein, the term "and/or" includes any and all combinations of one or more of the associated listed items and may be abbreviated as "/".

Although some aspects have been described in the context of an apparatus or device, it is clear that these aspects also represent a description of a method of operating such an apparatus or device.

Further embodiments and their advantages are described below in connection with the following figures.

In the following, the figures are described comprehensively, with the same or analogue reference signs designating the same or at least structurally identical components.

FIG. 1 schematically shows a sample holder transfer device 100 for use in cryo-microscopy for transferring a sample holder 150 to an analysing or processing unit, with details of the sample holder transfer device 100 relevant to embodiments of the present invention being shown in FIG. 1. In this embodiment, the sample holder transfer device 100 is shown with the sample holder 150 placed in a dedicated loading position 102 of the sample holder transfer device 100. The sample holder 150 is configured for holding a sample carrier 170 as will be further described in connection with the following figures.

Figure 2A:
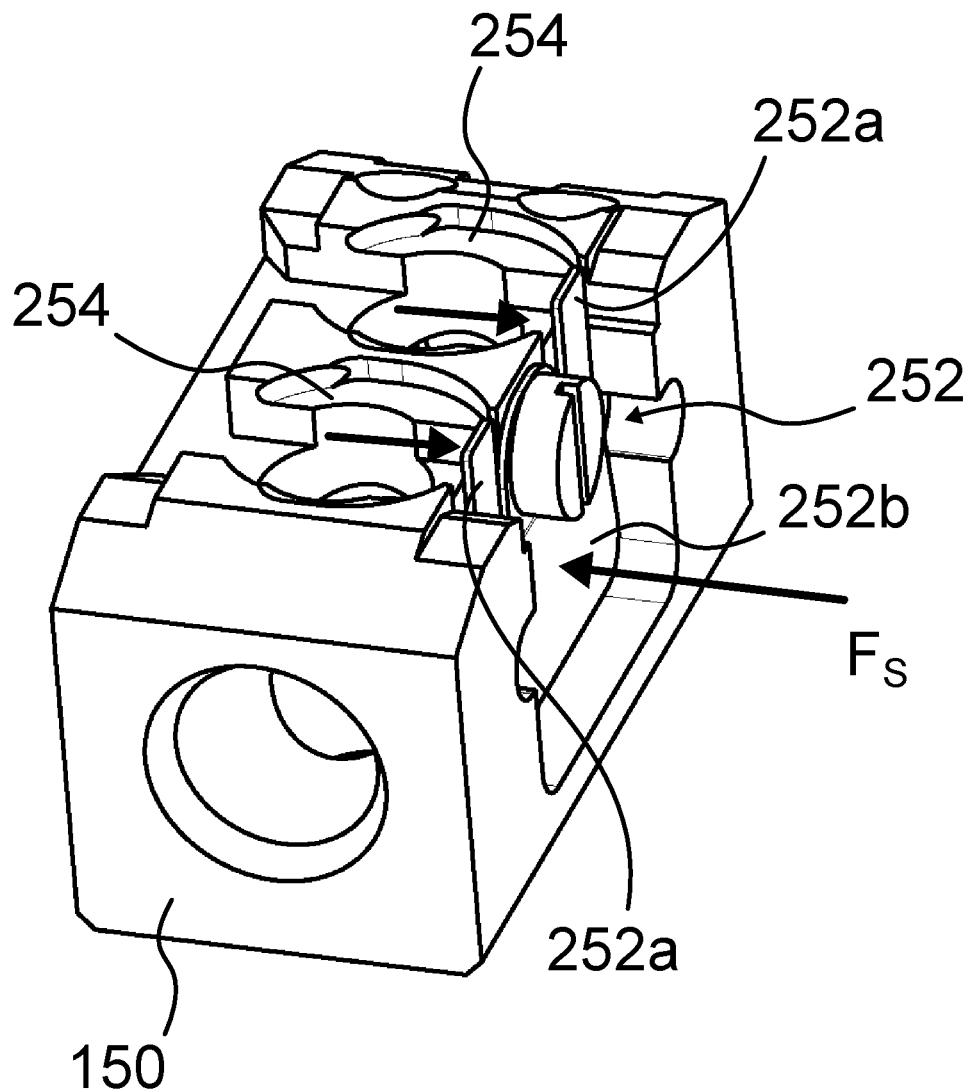
FIGS. 2a and 2b schematically show an example of a sample holder suited for use in the sample holder transfer device of FIG. 1, wherein the sample holder is shown in a second position (FIG. 2a) and in a first position (FIG. 2b)
Figure 2B:
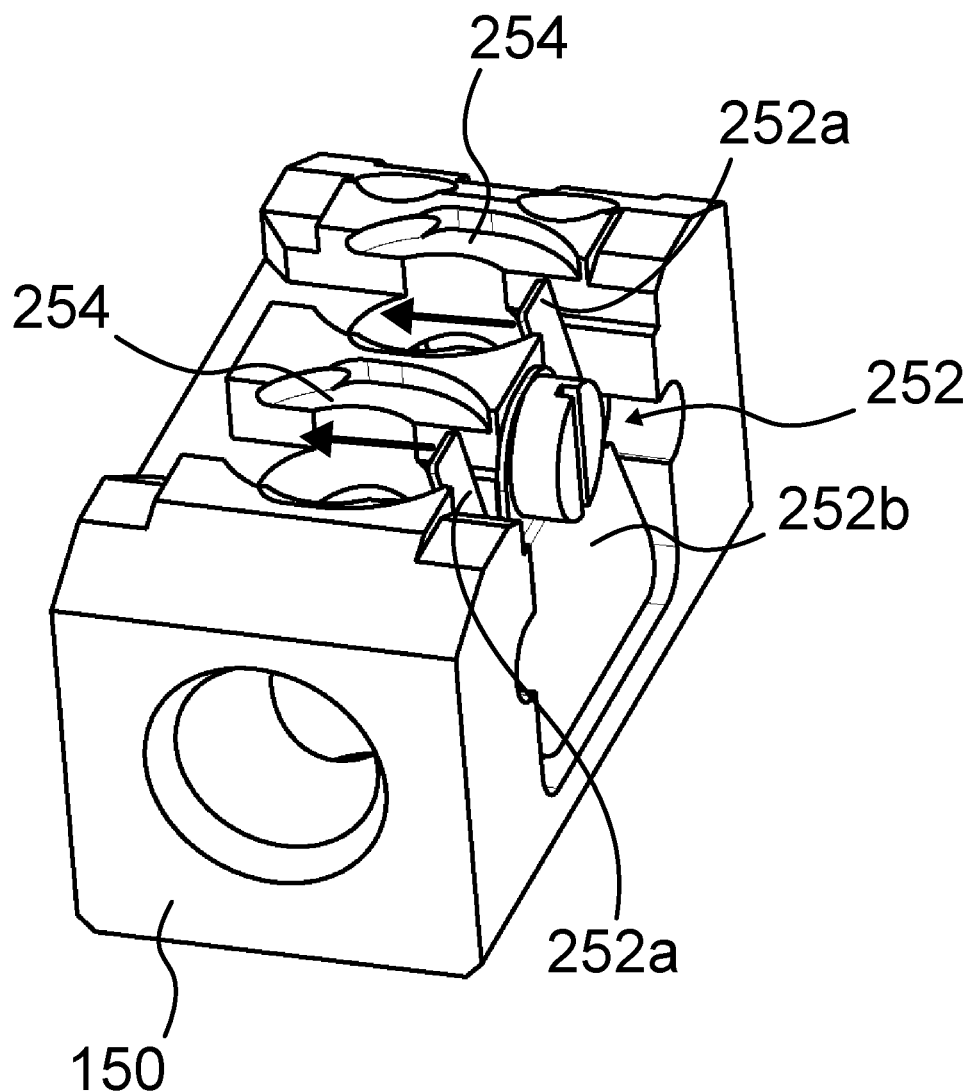

The sample holder transfer device 100 is configured to receive a sample holder 150, an example of which is shown in FIGS. 2A-2B. It should be noted that also other kinds of sample holders 150 can be used with the sample holder transfer device 100 as long as the sample holder 150 comprises a sample carrier fixing element, which can be switched from an "open position" to a "closed position" and/or from a "closed position" to an "opened position." In other words, according to the example shown in FIGS. 2A-2B, at least one section 252a of the sample carrier fixing element 252 is configured, when in a first position, to fix the sample carrier 170 to the sample holder 150 (see FIG. 2B), and, when in a second position, to release the sample carrier 170 or to provide access to an area 254 where the sample carrier 170 is to be placed (see FIG. 2A).

The sample holder transfer device 100 of FIG. 1 comprises a switching mechanism 110 operable to switch the at least one section 252a of the sample carrier fixing element 252 of the sample holder 150 from the first position to the second position and/or from the second position to the first position.

Embodiments of the switching mechanism 110 of the sample holder transfer device 100 are now described in further detail.

The switching mechanism 110 as shown in FIG. 1 may be a combination of the following elements: a pin 118 being rotatably mounted in the sample holder transfer device 100. The pin 118 is rotatable about its longitudinal axis 119 and is configured to assume, by rotation about a predetermined angular range, two positions corresponding to a first and a second position of the switching mechanism 110 as will be further described in connection with FIG. 3. The switching mechanism 110 may further comprise a cam element 112. The cam element 112 may be connected to the pin 118 or be an integral part of it (as shown in the embodiment in FIG. 1). The cam element 112 may interact with an intermediate element 114 such that the intermediate element 114 acts upon the sample carrier fixing element 252. In the embodiment shown in FIG. 1, the intermediate element 114 is another element of the switching mechanism 110. The intermediate element 114 may comprise a spring element 116 or consist of such a spring element 116.

In other embodiments, other constructions of the switching mechanism 110 may be expedient. For example, the switching mechanism 110 may be an essentially resilient element, similar to the intermediate element 114 shown in FIG. 1, preferably biased to a position, in which the sample carrier fixing element is in its closed position. An actuating force onto the resilient element would switch the sample carrier fixing element into its open position. In such an example, operation of the switching element would be exerting a direct actuating force onto the resilient element without any further mechanical power transmitting elements. In another example, the switching mechanism 110 may mainly be based onto a cam element, like the cam element 112 as shown in FIG. 1, directly interacting with the sample carrier fixing element in order to switch it from an open position to a closed position or vice versa. Other examples of possible implementations of the switching mechanism 110 are described in the Summary section.

Figure 3:
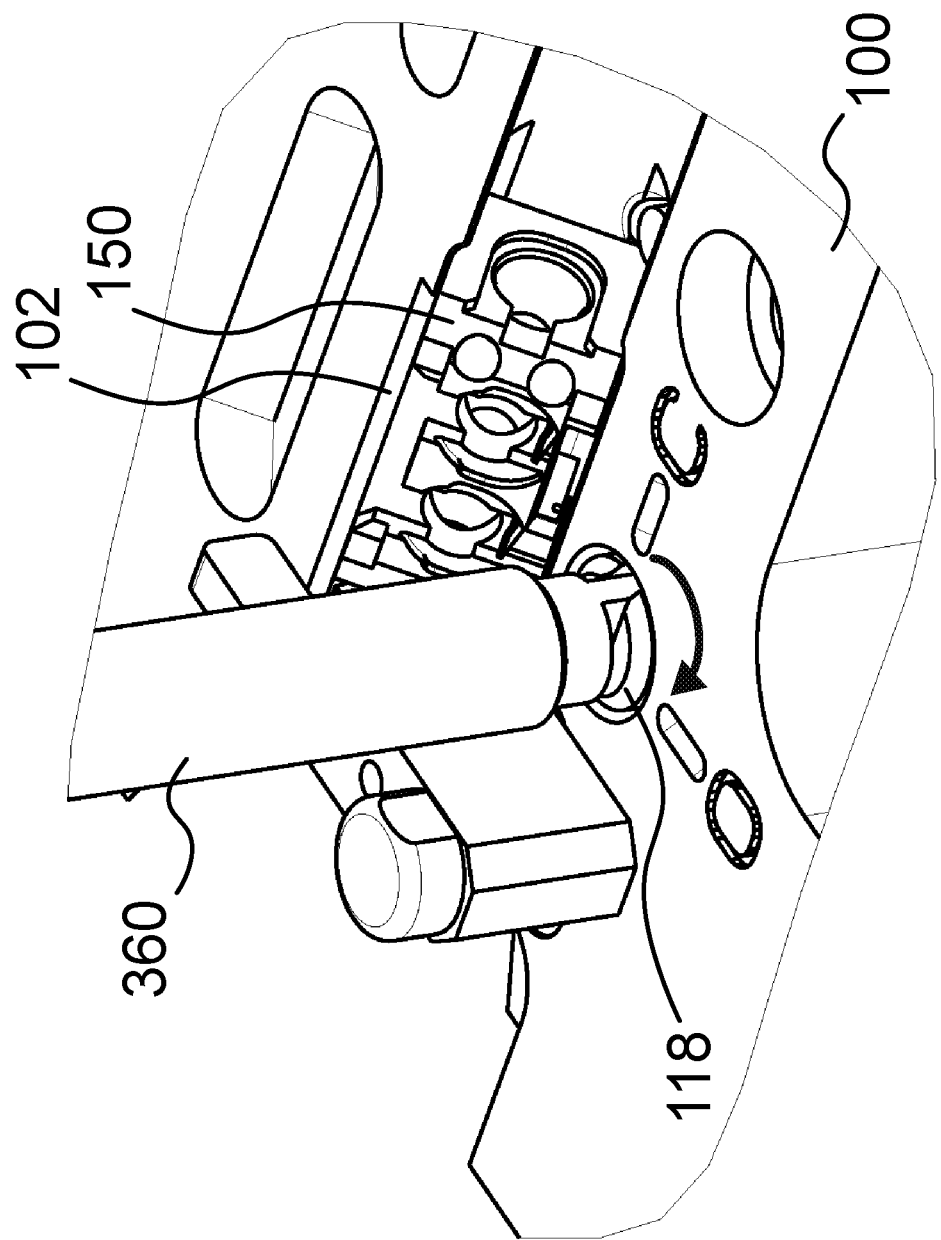
FIG. 3 shows a detail of a perspective top view of the sample holder transfer device of FIG. 1.

As shown in FIG. 3, the pin 118 of the switching mechanism 110 may be configured to be operated by a tool 360 like a screwdriver for rotating the pin 118 about its longitudinal axis 119. As can be seen from FIG. 3, the pin 118 of the switching mechanism 110 may thus be configured to be set into a first position C and to be set into a second position O, e.g. by rotating the pin 118 by 90°. By rotating the pin 118 into the second position O, the switching mechanism 110 switches section 252a of the sample carrier fixing element 252 into its second open position such that access to an area 254 where the sample carrier 170 is to be placed is provided or a sample carrier 170 placed in the area 254 is released. This operation shall now be described in more detail.

Rotating the pin 118 of the switching mechanism 110 from the first position C to the second position O results in a corresponding movement, here a corresponding rotation of the cam element 112 connected to the pin 118. The cam surface of the cam element 112 may act directly upon the intermediate member 114, which in turn acts upon the sample carrier fixing element 252. It may also be possible that the cam surface of the cam element 112 directly acts upon the sample carrier fixing element 252. The intermediate element 114 may comprise a spring element 116 as shown in FIG. 1. The spring element 116 may be biased in a direction away from the sample holder 150. In the first position C of the pin 118, the cam surface of the cam element 112 exerts no force or a force less than a predetermined threshold force onto the spring element 116. Depending on the shape of the cam surface, this force may increase when rotating the pin 118 towards the second position O. In the second position O, this force is equal to or exceeds the threshold force such that the intermediate element 114 switches the sample carrier fixing element 152 in its second (open) position. In this position, the sample holder 150 is ready to receive a sample carrier 170, or, a sample carrier 170 already placed in the area 254 of the sample holder 150 can be removed. Further, in this position, the intermediate member 114 exerts a force at least equal to a predetermined force $F_S$ onto the second section 252b of the sample carrier fixing element 252 (see FIG. 2A).

The sample holder 150 according to the embodiment of FIG. 2A comprises two areas 254 where sample carriers 170 can be placed. In order to place a sample carrier 170 onto an area 254, the corresponding first section 252a of the sample carrier fixing element 252 needs to be in an open state. The sample carrier fixing element 252 according to this embodiment comprises an essentially resilient element, which comprises two sections 252a and 252b, preferably at opposite ends, the first section 252a of which bends backwards if an external force is exerted onto the second section 252b of the sample carrier fixing element 252. When this force is at least equal to a predetermined force $F_S$, the first section 252a is in an open position such that a sample carrier 170 can be inserted in the area 254.

After having placed a sample carrier 170 onto an area 254 of the sample holder 150, the sample carrier 170 needs to be fixed to the sample holder 150 in order to transfer the sample holder 150 together with the sample to a processing unit or to an analysing unit, examples of such units have been described above. To this end, the switching mechanism 110 may be configured to be set into a first position C, in which the switching mechanism switches the at least one section, here the first section 252a, of the sample carrier fixing element 252 into its first closed position. As shown in the embodiment of FIG. 3, this may be done by rotating the pin 118 by means of a tool 360 like a screwdriver back to the position C. This leads to a process where the force exerted by the cam surface of the cam element 112 onto the intermediate element 114 is reduced such that the predetermined force $F_S$ is no longer exerted onto the second section 252b of the sample carrier fixing element 252 of the sample holder 150. The cam surface of the cam element 112 may be designed such that in the position C of pin 118 of the switching mechanism 110 no force is exerted onto the second section 252b by the intermediate element 114. Such a situation is shown in FIG. 2B. The first section 252a of the sample carrier fixing element 252 is biased towards the area 254 for a sample carrier 170. If no force acts upon the second section 252b, the first section 252a may return to its first closed position. In this position, a sample carrier 170 is fixed to the sample holder 150.

Figure 4:
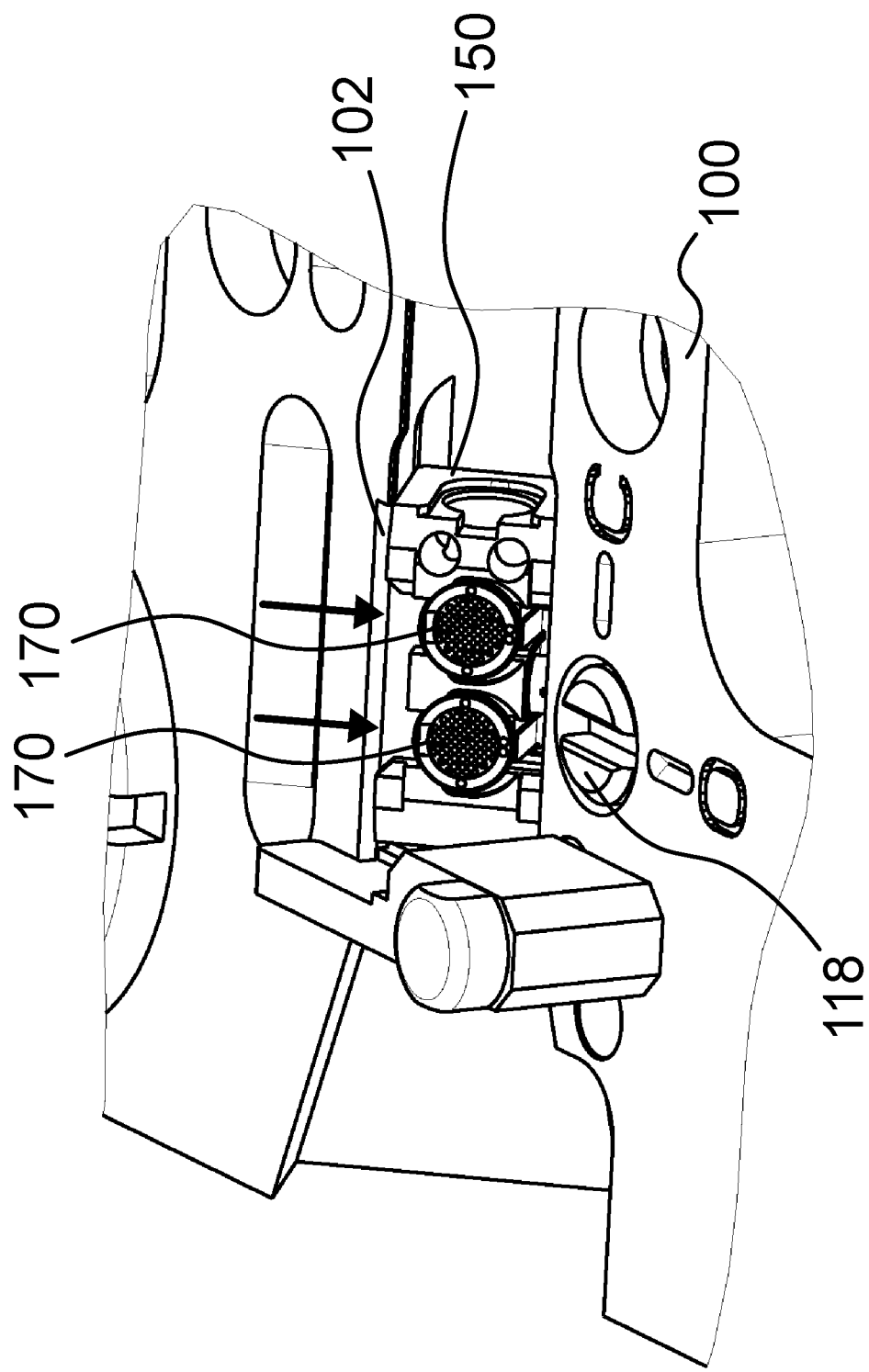
FIG. 4 shows a similar view as FIG. 3 of a sample holder transfer device where the sample holder includes two sample carriers.

FIG. 4 shows a situation where the sample holder 150 is placed in a loading position 102 of the sample holder transfer device 100. As can be seen, the switching mechanism 110, more precisely the pin 118, is in the second position O. As explained above, in this position the first section 252a of the sample carrier fixing element 252 of the sample holder 150 is switched into its second open position allowing insertion of a sample carrier 170. As shown in FIG. 4, two sample grids, here so-called "autogrids," may be placed onto the respective areas 254 of the sample holder 150.

It may be advantageous if the switching mechanism 110 is configured to fix the sample holder 150 to the sample holder transfer device 100, when the switching mechanism, as shown in FIG. 4, is operated to switch the first section 252a of the sample carrier fixing element 252 into its second open position. Thus, during insertion of the sample carriers 170 the sample holder 150 remains in a fixed position such that a sample carrier 170 can be easily inserted and the orientation of a sample carrier 170 may be easily adjusted. In the embodiment shown in FIG. 1, fixing of the sample holder 150 may be achieved through a pushing force of the intermediate element for operating the second section 252b and, simultaneously, for pressing the sample holder 150 against sidewalls at the loading position 102 of the sample holder transfer device 100.

Figure 5:
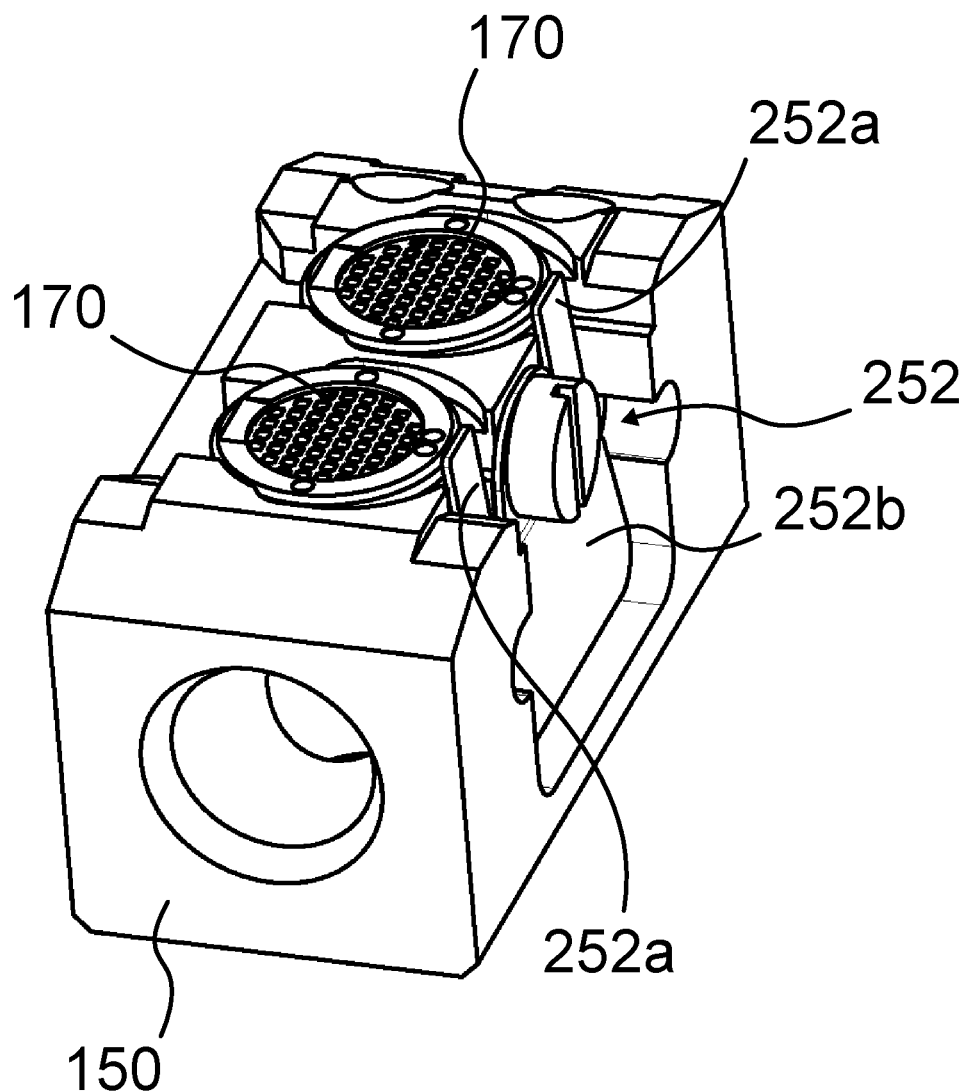
FIG. 5 shows the sample holder of FIG. 4 carrying two sample carriers.

FIG. 5 shows a situation similar to that of FIG. 2B with two sample carriers 170 placed onto the respective areas 254 of the sample holder 150. The situation shown in FIG. 5 can be achieved by setting the switching mechanism 110, here the pin 118, into its first position C. The corresponding process has already been described above.

Figure 6:
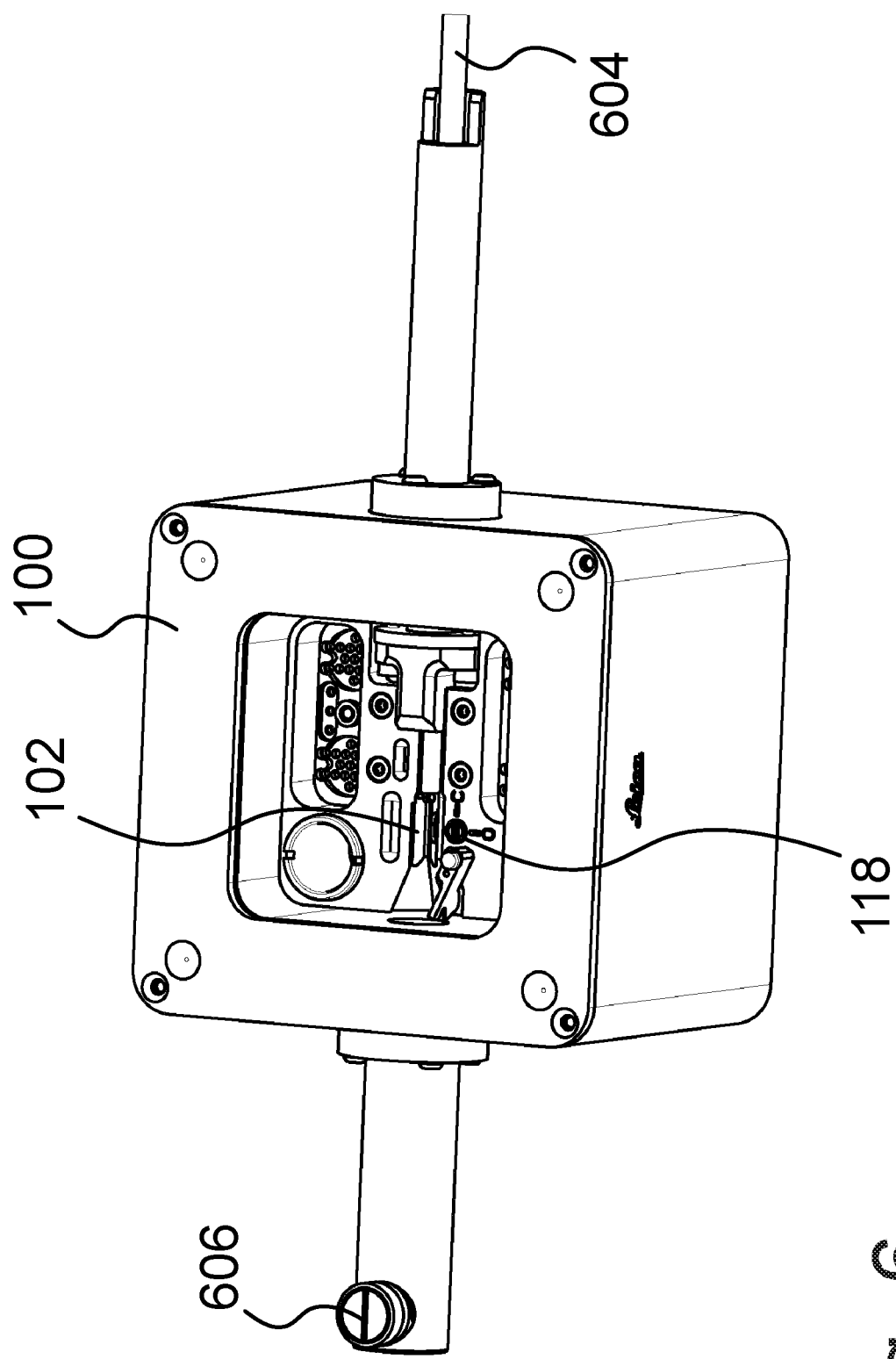
FIG. 6 schematically shows a sample holder transfer device according to an embodiment of the present invention in a perspective top view.

FIG. 6 schematically shows a perspective top view of a sample holder transfer device 100 according to an embodiment. The inner space of the sample holder transfer device 100 comprises different storage areas for sample carriers/grids, storage boxes and the like, and a predefined place for a sample holder 150 at the loading position 102. The top of the pin 118 is also visible. Once the sample carriers 170 are placed and fixed to the sample holder 150, the sample holder 150 can be connected to a transfer rod 604 and, after opening the shutter 606, be transferred to a processing or an analysing unit. As can be seen from FIGS. 6 and 3, inserting (or removing) of sample carriers 170 and operating the switching mechanism 110, here by rotating the pin 118, can be performed from essentially the same side, thus facilitating the handling process.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE SIGNS 100 sample holder transfer device
102 loading position
110 switching mechanism
112 cam element
114 intermediate element
116 spring element
118 pin
119 longitudinal axis
150 sample holder
170 sample carrier
252 sample carrier fixing element
252a first section
252b second section
254 area for sample carrier
360 tool
604 transfer rod
606 shutter

The invention claimed is:

1. A sample holder transfer device for use in cryo-microscopy for transferring a sample holder to an analyzing or processing unit, the sample holder being configured for holding a sample carrier carrying a sample, the sample holder transfer device being configured to receive the sample holder in a predefined place at a loading position, the sample holder comprising a sample carrier fixing element, at least one section of the sample carrier fixing element being configured, when in a first position, to fix the sample carrier to the sample holder, and, when in a second position, to release the sample carrier or to provide access to an area where the sample carrier is to be placed, the sample holder transfer device comprising:
   a switching mechanism operable to switch the at least one section of the sample carrier fixing element of the sample holder from the first position to the second position or from the second position to the first position, wherein the switching mechanism comprises a cam element; and
   a transfer rod configured to be connected to the sample holder for transferring the sample holder from the predefined place at the loading position to the analyzing or processing unit.

2. The sample holder transfer device according to claim 1, wherein the switching mechanism is configured to be set into a first switching position, in which the switching mechanism switches the at least one section of the sample carrier fixing element into the first position, and configured to be set into a second switching position, in which the switching mechanism switches the at least one section of the sample carrier fixing element into the second position.

3. The sample holder transfer device according to claim 2, wherein the cam element comprises a pin, the pin being rotatably mounted in the sample holder transfer device and being rotatable about a longitudinal axis of the pin and being configured to assume, by rotation about a predetermined angular range, two positions corresponding to the first position and the second position of the switching mechanism.

4. The sample holder transfer device according to claim 3, wherein the switching mechanism further comprises an intermediate element, the cam element being configured to act upon the intermediate element, wherein the intermediate element comprises a spring element, and wherein in a first position of the pin, the cam element exerts no force or a force less than a predetermined threshold force onto the spring element, and in a second position of the pin, the cam element exerts a force equal to or exceeding the threshold force onto the spring element.

5. The sample holder transfer device according to claim 3, wherein the pin is configured to be operated by a tool for rotating the pin about the longitudinal axis of the pin.

6. The sample holder transfer device according to claim 5, wherein the pin is arranged to be operated by the tool from a side from where the sample carrier is to be placed into the sample holder.

7. The sample holder transfer device according to claim 1, wherein the cam element is configured to interact with the at least one section of the sample carrier fixing element in order to, upon operation of the switching mechanism, switch the at least one section of the sample carrier fixing element into the first position and/or into the second position.

8. The sample holder transfer device according to claim 1, wherein the switching mechanism further comprises an intermediate element, the cam element being configured to act upon the intermediate element, wherein the intermediate element comprises a spring element.

9. The sample holder transfer device according to claim 1, wherein the at least one section of the sample carrier fixing element of the sample holder forms a first section, and the sample carrier fixing element further comprises a second section different from the first section, the second section being operable by the switching mechanism such that upon operation of the second section, the first section switches from a first switching position into a second switching position or from the second switching position into the first switching position.

10. The sample holder transfer device according to claim 9, wherein the first section and the second section of the sample carrier fixing element form at least a part of a resilient element.

11. The sample holder transfer device according to claim 9, wherein the switching mechanism, by acting upon the second section of the sample carrier fixing element, switches the first section of the sample carrier fixing element of the sample holder from the first position to the second position and/or from the second position to the first position.

12. The sample holder transfer device according to claim 11, wherein the switching mechanism is configured such that, in the first switching position, no force or a force less than a predetermined force is exerted onto the second section of the sample carrier fixing element, and, in the second switching position, a force equal to or greater than the predetermined force is exerted onto the second section of the sample carrier fixing element.

13. The sample holder transfer device according to claim 9, wherein the switching mechanism is configured to fix the sample holder to the sample holder transfer device, when the switching mechanism is operated to switch the first section of the sample carrier fixing element into the second position.

* * * * *